(12) United States Patent
Miglani et al.

(10) Patent No.: US 11,387,840 B1
(45) Date of Patent: Jul. 12, 2022

(54) DELAY FOLDING SYSTEM AND METHOD

(71) Applicant: Texas Instruments Incorporated, Dallas, TX (US)

(72) Inventors: Eeshan Miglani, Chhindwara (IN); Visvesvaraya Appala Pentakota, Bengaluru (IN); Chirag Chandrahas Shetty, Thane (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/129,180

(22) Filed: Dec. 21, 2020

(51) Int. Cl.
*H03M 1/60* (2006.01)
*H03M 1/50* (2006.01)
*H03M 1/46* (2006.01)
*H03M 1/20* (2006.01)

(52) U.S. Cl.
CPC .......... *H03M 1/502* (2013.01); *H03M 1/204* (2013.01); *H03M 1/46* (2013.01)

(58) Field of Classification Search
CPC ........ H03M 1/502; H03M 1/46; H03M 1/204; H03M 1/12
USPC ....................................................... 341/157
See application file for complete search history.

(56) References Cited

U.S. PATENT DOCUMENTS

| | | | |
|---|---|---|---|
| 4,612,533 A | 9/1986 | Evans | |
| 4,899,071 A | 2/1990 | Morales | |
| 4,928,103 A | 5/1990 | Lane | |
| 5,317,721 A | 5/1994 | Robinson | |
| 5,495,247 A | 2/1996 | Yamamoto et al. | |
| 5,563,533 A | 10/1996 | Cave et al. | |
| 5,821,780 A | 10/1998 | Hasegawa | |
| 6,002,352 A | 12/1999 | El-Ghoroury et al. | |
| 6,046,612 A | 4/2000 | Taft | |
| 6,069,579 A | 5/2000 | Ito et al. | |

(Continued)

FOREIGN PATENT DOCUMENTS

| JP | H05206801 | 8/1993 |
|---|---|---|
| KR | 20000028857 | 5/2000 |

(Continued)

OTHER PUBLICATIONS

U.S. Appl. No. 16/517,796, Notice of Allowance, dated Feb. 6, 2020, p. 7.

(Continued)

*Primary Examiner* — Jean B Jeanglaude
(74) *Attorney, Agent, or Firm* — Mark A. Valetti; Charles A. Brill; Frank D. Cimino

(57) ABSTRACT

A system for converting a voltage into output codes includes logic gates for processing delay signals based on earlier and later arriving signals generated by preamplifiers, delay comparators for generating digital signals representative of most significant bits of respective codes, and for transmitting delay residue signals representative of less significant bits of the codes, and an auxiliary delay comparator for generating an auxiliary digital signal for use in generating the output codes. A system may include logic gates for generating delay signals based on earlier and later arriving signals, delay comparators for generating digital signals representative of most significant bits of respective codes, and for transmitting delay residue signals representative of less significant bits, and a multiplexer system for transmitting a selected one of the residue signals.

19 Claims, 5 Drawing Sheets

(56) References Cited

U.S. PATENT DOCUMENTS

| | | |
|---|---|---|
| 6,124,746 A | 9/2000 | Van Zalinge |
| 6,144,231 A | 11/2000 | Goldblatt |
| 6,314,149 B1 | 11/2001 | Daffron |
| 6,377,200 B1 | 4/2002 | Lee |
| 6,822,596 B2 | 11/2004 | Theiler |
| 6,836,127 B2 | 12/2004 | Marshall |
| 7,046,179 B1 | 5/2006 | Taft et al. |
| 7,233,172 B2 | 6/2007 | Kanamori et al. |
| 7,262,724 B2 | 8/2007 | Hughes et al. |
| 7,379,007 B2 | 5/2008 | Noguchi |
| 7,405,689 B2 * | 7/2008 | Kernahan ............... H03M 1/38 341/155 |
| 7,501,862 B2 | 3/2009 | Su et al. |
| 7,525,471 B2 | 4/2009 | Prodic et al. |
| 7,557,746 B1 | 7/2009 | Waltari |
| 7,738,265 B2 | 4/2010 | Trattler |
| 7,737,875 B2 | 6/2010 | Waltar et al. |
| 7,847,576 B2 | 12/2010 | Koiima |
| 7,916,064 B2 | 3/2011 | Lin et al. |
| 7,919,994 B2 | 4/2011 | Walker |
| 8,089,388 B2 | 1/2012 | Cui et al. |
| 8,130,130 B2 | 3/2012 | Danjo et al. |
| 8,183,903 B2 | 5/2012 | Glass et al. |
| 8,373,444 B2 | 2/2013 | Lee et al. |
| 8,421,664 B2 | 4/2013 | Ryu et al. |
| 8,773,169 B2 | 7/2014 | Dinc et al. |
| 8,836,375 B2 | 9/2014 | Ghatak |
| 8,896,476 B2 | 11/2014 | Harpe |
| 9,369,137 B2 | 6/2016 | Masuko |
| 9,455,695 B2 | 9/2016 | Kull et al. |
| 9,467,160 B2 | 10/2016 | Chang |
| 9,685,971 B2 | 6/2017 | Harada |
| 9,742,424 B2 * | 7/2017 | Sharma ............... H03M 1/1245 |
| 9,917,590 B2 | 3/2018 | Zhang et al. |
| 10,003,353 B2 | 6/2018 | Kris et al. |
| 10,284,188 B1 | 5/2019 | Soundararajan et al. |
| 10,673,452 B1 | 6/2020 | Soundararajan et al. |
| 10,673,453 B1 | 6/2020 | Pentakota et al. |
| 10,673,456 B1 | 6/2020 | Dusad et al. |
| 10,778,243 B2 | 9/2020 | Pentakota et al. |
| 10,958,258 B2 | 3/2021 | Soundanarajan et al. |
| 2005/0104626 A1 | 5/2005 | Wakamatsu et al. |
| 2006/0158365 A1 * | 7/2006 | Kernahan ............... H03M 1/38 341/155 |
| 2008/0297381 A1 * | 12/2008 | Kernahan ............... H03M 1/38 341/51 |
| 2010/0085101 A1 | 4/2010 | Walker |
| 2012/0105264 A1 | 5/2012 | Ryu et al. |
| 2012/0176158 A1 | 7/2012 | Lee et al. |
| 2012/0212358 A1 | 8/2012 | Shi et al. |
| 2013/0009796 A1 | 1/2013 | Sakiyama et al. |
| 2013/0021118 A1 | 1/2013 | Kabir et al. |
| 2013/0169463 A1 | 7/2013 | Stein et al. |
| 2014/0361917 A1 | 12/2014 | Matsuno et al. |
| 2015/0008894 A1 | 1/2015 | Cannankurichi et al. |
| 2015/0244386 A1 | 8/2015 | El-Chammas |
| 2015/0260552 A1 | 9/2015 | Yao et al. |
| 2019/0007071 A1 | 1/2019 | Nagarajan et al. |
| 2019/0280703 A1 | 9/2019 | Naru et al. |
| 2020/0195268 A1 | 6/2020 | Soundararajan et al. |

FOREIGN PATENT DOCUMENTS

| | | |
|---|---|---|
| KR | 2001044806 | 2/2001 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

U.S. Appl. No. 17/158,526, Notice of Allowance, dated Jan. 14, 2022, p. 8.

* cited by examiner

DELAY FOLDING SYSTEM AND METHOD

BACKGROUND

An analog-to-digital (A/D) converter (ADC) system may be used to generate digital codes which represent an analog signal. A direct radio-frequency (RF) sampling receiver may be used to receive and directly digitize a high frequency analog signal. An analog-to-digital converter system for digitizing a signal in a direct radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.), and 2019/0280703 (Naru et al.).

Some analog-to-digital converters have one or more voltage-to-delay (V2D) components and operate, at least in part, in a delay domain. Delay-based analog-to-digital converters are described in U.S. Pat. No. 10,673,452 (Soundararajan et al.), U.S. Pat. No. 10,673,456 (Dusad et al.), and U.S. Pat. No. 10,673,453 (Pentakota et al.). The entire disclosures of U.S. Pat. Nos. 10,673,452, 10,673,456, and 10,673,453 are incorporated herein by reference. In addition, the entire disclosures of the five U.S. patent applications identified below in Table 1 are incorporated herein by reference.

TABLE 1

| Title | Inventors | Ser. No. |
|---|---|---|
| PIECEWISE CALIBRATION FOR HIGHLY NON-LINEAR MULTI-STAGE ANALOG-TO-DIGITAL CONVERTER | Narasimhan Rajagopal, Visvesvaraya Pentakota and Eeshan Miglani | 17/126,157 |
| DIFFERENTIAL VOLTAGE-TO-DELAY CONVERTER WITH IMPROVED CMMR | Prasanth K, Eeshan Miglani, Visvesvaraya Appala Pentakota, Kartik Goel, Venkataraman Jagannathan and Sai Aditya Nurani | 17/182,339 |
| SAMPLING NETWORK WITH DYNAMIC VOLTAGE DETECTOR FOR DELAY OUTPUT | Eeshan Miglani, Visvesvaraya Pentakota, and Jaganathan Venkataraman | 17/131,981 |
| LOOKUP-TABLE-BASED ANALOG-TO-DIGITAL CONVERTER | Visvesvaraya Pentakota, Narasimhan Rajagopal, Chirag Shetty, Prasanth K, Neeraj Shrivastava, Eeshan Miglani and Jagannathan Venkataraman | 17/158,526 |
| GAIN MISMATCH CORRECTION FOR VOLTAGE-TO-DELAY PREAMPLIFIER ARRAY | Narasimhan Rajagopal, Chirag Shetty, Neeraj Shrivastava, Prasanth K and Eeshan Miglani | 17/133,745 |

SUMMARY

This disclosure relates to a delay-based analog-to-digital converter system for converting an input voltage into digital output codes. According to one aspect of this disclosure, the system includes: logic gates for processing delay signals based on earlier and later arriving signals generated by preamplifiers; first delay comparators and second delay comparators, connected to the logic gates, for generating digital signals representative of most significant bits of respective first and second digital codes, and for transmitting delay residue signals representative of less significant bits of the first and second digital codes; and an auxiliary delay comparator, connected directly to two of the preamplifiers, for generating an auxiliary digital signal for use in generating the digital output codes based on the first and second digital codes.

The present disclosure also relates to a delay-based system for generating output delay signals for a delay-to-digital converter. According to one aspect of the present disclosure, the delay-based system includes: logic gates for processing delay signals based on earlier and later arriving signals; delay comparators, connected to the logic gates, for generating digital signals representative of most significant bits of respective digital codes, and for transmitting delay residue signals representative of less significant bits of the digital codes; and a multiplexer system, connected to the delay comparators, for transmitting a selected one of the delay residue signals based on one or more of the digital signals.

The present disclosure also relates to a method of converting an input voltage into digital output codes, including: causing logic gates to process delay signals based on earlier and later arriving signals generated by preamplifiers; causing first delay comparators and second delay comparators to generate digital signals representative of most significant bits of respective first and second digital codes, and to transmit delay residue signals representative of less significant bits of the first and second digital codes; and causing an auxiliary delay comparator to generate an auxiliary digital signal for use in generating the digital output codes based on the first and second digital codes.

The present disclosure also relates to a method of generating output delay signals for a delay-to-digital converter, including: causing logic gates to process delay signals based on earlier and later arriving signals; causing delay comparators to generate digital signals, based on the delay signals, representative of most significant bits of respective digital codes, and to transmit delay residue signals representative of less significant bits of the digital codes; and using a multiplexer system, connected to the delay comparators, to transmit a selected one of the delay residue signals based on one or more of the digital signals.

BRIEF DESCRIPTION OF THE DRAWINGS

Like elements are designated by like reference numerals and other characters throughout the drawings.

DETAILED DESCRIPTION

Figure 1:
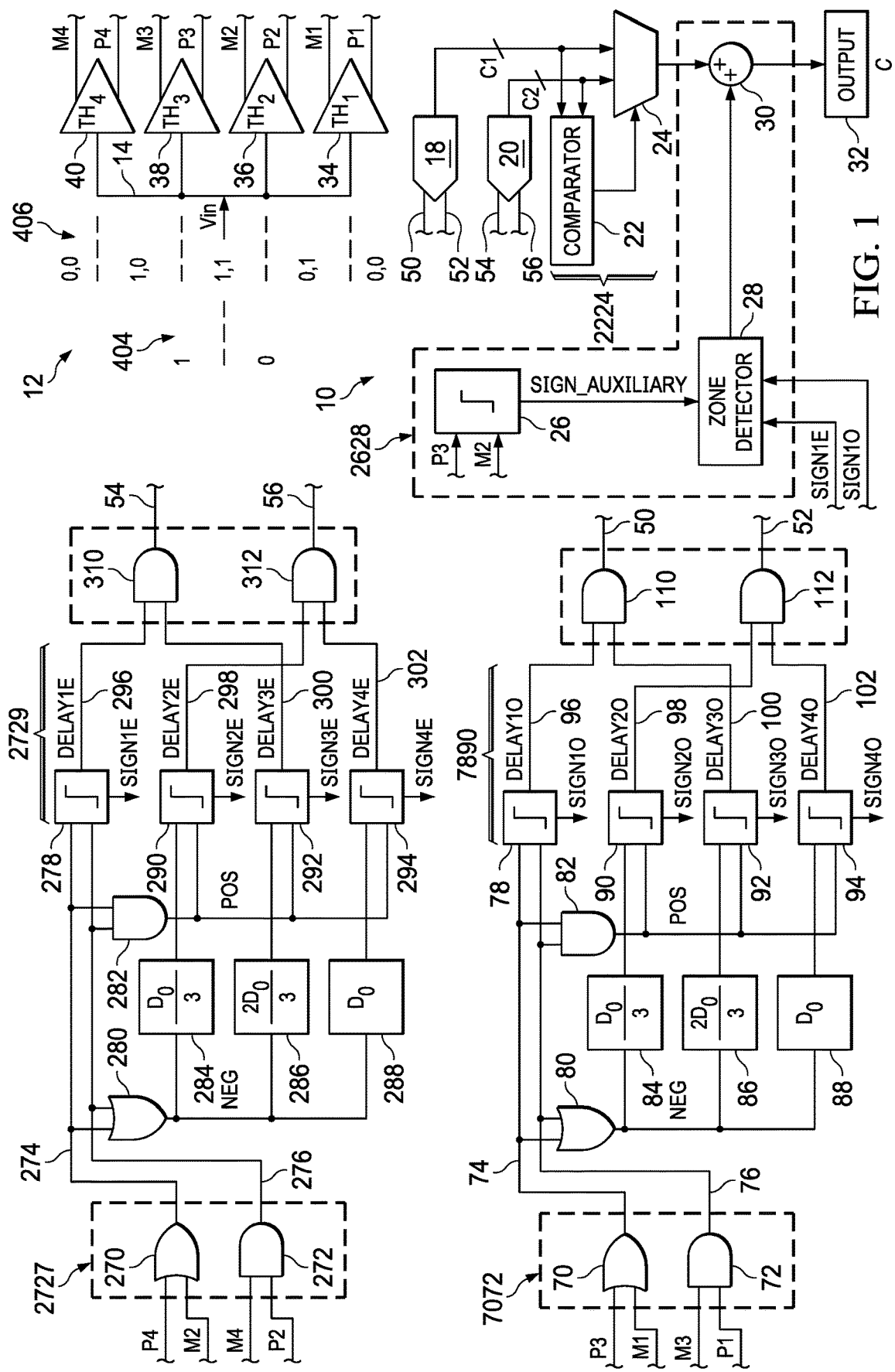
FIG. 1 is a block diagram of an example of an analog-to-digital converter system constructed in accordance with the present disclosure.

FIG. 1 illustrates an analog-to-digital converter system 10 which has a voltage-to-delay converter 12 for receiving sampled voltages Vin on an input line 14, a first folding circuit 7072 (which includes OR and AND gates 70 and 72, described below) and a second folding circuit 2727 (which includes OR and AND gates 270 and 272, described below) for processing delay signals (P1, P2, P3, P4, M1, M2, M3 and M4) generated by the voltage-to-delay converter 12, a first delay-to-digital circuit 7890 (which includes delay-to-digital circuits 78, 90, 92 and 94, described below) and a second delay-to-digital circuit 2729 (which includes delay-to-digital circuits 278, 290, 292 and 294, described below) for processing signals on first lines 74 and 76 and second lines 274 and 276, respectively, at least two delay-to-digital converters 18 and 20 for generating digital codes C1 and C2 based on outputs of the first and second delay-to-digital circuits 7890 and 2729, respectively, a selection circuit 2224 (which includes a comparator 22 and a multiplexer 24, described below) for selecting one of the digital codes C1 and C2, and an unfolding circuit 2628 (which includes an auxiliary comparator 26, a zone detector 28 and an adder circuit 30, described below) for generating digital output codes C at an output 32. In operation, the digital output codes C at the output 32 are representative of the corresponding voltages Vin on the input line 14. In some example embodiments, digital output code C may be five bits long. In other example embodiments, the digital output code may be less than or more than five bits long. In some example embodiments, the digital output code may be much more than five bits long.

As described in more detail below, the first folding circuit 7072, and the illustrated connections between the voltage-to-delay converter 12 and the first folding circuit 7072, constitute a selection circuit for selecting desired signals to be transmitted to the first delay-to-digital circuit 7890 on the first lines 74 and 76. Likewise, the second folding circuit 2727, and the illustrated connections between the voltage-to-delay converter 12 and the second folding circuit 2727, constitute another selection circuit for selecting desired signals to be transmitted to the second delay-to-digital circuit 2729 on the second lines 274 and 276. The selection logic of each folding circuit should choose the later of the earlier edges and the earlier of the later edges arriving at the respective folding circuit. The illustrated selection circuits provide substantial advantages as described in more detail below.

If desired, at least the voltage-to-delay converter 12, the folding circuits 7072 and 2727, the delay-to-digital circuits 7890 and 2729, and the delay-to-digital converters 18 and 20 may be integrated into an integrated circuit (IC) and/or formed on or over a single semiconductor die (not shown in the drawings) according to various semiconductor and/or other processes. The conductive lines may be metal structures formed in or between insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates and other suitable electronic devices that are not shown in the drawings for the sake of clarity. The present disclosure is not limited to the details and specific features of the examples shown in the drawings and otherwise described herein.

In the example illustrated in FIG. 1, the voltage-to-delay converter 12 has first, second, third and fourth preamplifiers 34, 36, 38 and 40. The present disclosure is not limited, however, to the illustrated example, and, if desired, may be implemented with a circuit that has more than, or fewer than, four preamplifiers. In the illustrated example, at a suitable timing, the input voltage Vin, on the input line 14, is applied to first inputs of the preamplifiers 34, 36, 38 and 40. First, second, third and fourth threshold voltages $TH_1$, $TH_2$, $TH_3$, $TH_4$ (where $TH_1 < TH_2 < TH_3 < TH_4$) are generated by a suitable threshold source (not shown) and applied to respective second inputs (not shown) of the preamplifiers 34, 36, 38 and 40.

The input voltage Vin may be, from time to time, less than or equal to the first threshold voltage $TH_1$, between the first and fourth voltages $TH_1$ and $TH_4$, or greater than the fourth voltage $TH_4$. In operation, the input voltage Vin is converted into delay signals within the voltage-to-delay converter 12 (also referred to herein as a preamplifier frontend, or a voltage-to-delay converter block), across the desired range of the input voltage Vin. In particular, the preamplifiers 34, 36, 38 and 40 are configured to generate first delay signals M1, M2, M3 and M4 on respective first output lines, and second delay signals P1, P2, P3 and P4 on respective second output lines.

The relative timings of the delay signals M1, M2, M3, M4, P1, P2, P3 and P4 correspond to the input voltage Vin. For example, if the input voltage Vin is less than, but relatively close to, the third threshold voltage $TH_3$, then the first delay signal M3 from the third preamplifier 38 precedes the second delay signal P3 from the same preamplifier 38, the first delay signal M4 from the fourth preamplifier 40 and the second delay signals P2 and P1 from the second and first preamplifiers 36 and 34 are even earlier than the first delay signal M3 from the third preamplifier 38, and the second delay signal P4 from the fourth preamplifier 40 and the first delay signals M2 and M1 from the second and first preamplifiers 36 and 34 are even later than the second delay signal P3 from the third preamplifier 38. In essence, the delay between signals M3 and P3 is less than the delays between signals M1/P1, M2/P2 and M4/P4. Hence, the delay relating to M3/P3 is the most informative.

Within the voltage-to-delay converter 12, if the input voltage Vin is greater than the threshold of a respective preamplifier, then the second delay signal (P1, P2, P3 or P4) from that preamplifier precedes the first delay signal (M1, M2, M3 or M4) from that preamplifier. On the other hand, if the input voltage Vin is less than the threshold of the preamplifier, then the first delay signal (M1, M2, M3 or M4) from that preamplifier precedes the second delay signal (P1, P2, P3 or P4) from that preamplifier. In other words, the delay signal from one of the second output lines precedes the delay signal from the corresponding one of the first output lines when the input voltage Vin is greater than the threshold voltage of the respective preamplifier. Conversely, the delay signal from one of the second output lines follows (lags behind) the delay signal from the corresponding first output line when the input voltage Vin is less than the threshold voltage of the respective preamplifier.

When the sampled input voltage Vin is midway between the threshold voltages $TH_2$ and $TH_3$ of the second and third (adjacent) preamplifiers 36 and 38, then the absolute value of the difference in timings of the respective delay signals M2, P2, M3 and P3 generated by those preamplifiers 36 and 38 is the same, delay signals P2 and M3 are aligned, delay signals M2 and P3 are aligned, and delay signals P2 and M3 precede delay signals M2 and P3.

When the input voltage Vin is between the threshold voltages of adjacent preamplifiers, but closer to the threshold voltage of one of the adjacent preamplifiers, then the magnitude of the delay associated with the signals from that one preamplifier corresponds to the value of the input voltage Vin relative to (1) the mid-point voltage halfway between the adjacent threshold voltages and (2) the threshold voltage to which the input voltage Vin is closest. If there is no difference in the timing of the two signals, then the input voltage Vin is equal to the mid-point voltage halfway between the adjacent threshold voltages.

The term "adjacent preamplifiers," as used in the present disclosure, means two preamplifiers whose threshold voltages are both less than, or greater than, the threshold voltage of any other preamplifier in the voltage-to-delay converter 12. For example, the first and second preamplifiers 34 and 36 illustrated in FIG. 1 are adjacent preamplifiers because their threshold voltages $TH_1$ and $TH_2$ are both less than the threshold voltages $TH_3$ and $TH_4$ of the third and fourth preamplifiers 38 and 40. Likewise, the second and third preamplifiers 36 and 38 are adjacent preamplifiers because their threshold voltages $TH_2$ and $TH_3$ are both greater than the threshold voltage $TH_1$ of the first preamplifier 34, and both less than the threshold voltage $TH_4$ of the fourth preamplifier 40. The first and third preamplifiers 34 and 38, on the other hand, are not adjacent preamplifiers, because their threshold voltages $TH_1$ and $TH_3$ are neither both less than nor both greater than the threshold voltage $TH_2$ of the second preamplifier 36. The existence of the second preamplifier 36 in the voltage-to-delay converter 12 prevents the first and third preamplifiers 34 and 38 from being considered adjacent preamplifiers.

In the example illustrated in FIG. 1, the delay information developed by the first and third preamplifiers (the "odd" preamplifiers) 34 and 38 is processed separately from, and parallel to, the delay information developed by the second and fourth preamplifiers (the "even" preamplifiers) 36 and 40. Delay signals from the odd preamplifiers 34 and 38, which are not adjacent to each other, are used to generate delay signals that are applied, on lines 50 and 52, to the first delay-to-digital converter 18. Delay signals from the even preamplifiers 36 and 40, which also are not adjacent to each other, are used to generate delay signals that are applied, on lines 54 and 56, to the second delay-to-digital converter 20.

The voltage-to-delay converter 12 is connected to the first folding circuit 7072 as follows: The second signal P3 of the third preamplifier 38 is applied to a first input of a first OR gate (an example of a logic gate) 70, the first signal M1 of the first preamplifier 34 is applied to the second input of the first OR gate 70, the first signal M3 of the third preamplifier 38 is applied to the first input of a first AND gate (another example of a logic gate) 72, and the second signal P1 of the first preamplifier 34 is applied to the second input of the first AND gate 72.

For any input voltage Vin, neither the OR gate 70 nor the AND gate 72 receives two delay signals from a single preamplifier. If it were otherwise, that is, if the OR gate 70 or the AND gate 72 were to receive two delay signals from a single preamplifier, then there would be a processing loss when critical delay signals were close to each other. Thus, an advantageous feature of the first selection circuit is that processing loss may be avoided by ensuring that critical delay signals do not go through the same gate. The term "critical delay signals" means two delay signals, from a group of delay signals generated by a voltage-to-delay converter, whose relative timings are the most representative of the input voltage Vin applied to the voltage-to-delay converter 12.

In the illustrated configuration, the OR gate 70 is used to select the earlier-arriving edge (that is, the earlier-arriving of delay signals P3 and M1), while the AND gate 72 is used to select the later-arriving edge (that is, the later-arriving of delay signals M3 and P1). As a practical matter, however, in transistor implementation, the output (on line 74) of the OR gate 70 represents the earlier-arriving edge when the two arriving edges (of delay signals P3 and M1) are sufficiently spaced apart. Similarly, the output (on line 76) of the AND gate 72 represents the later-arriving edge when the arriving edges (of delay signals M3 and P1) are sufficiently far apart. Otherwise the outputs (on lines 74 and 76) are dependent on both edges, and the logic gates 70, 72 lose their selection property. Hence, in the illustrated configuration, no two close-in-time edges that matter are input to the same logic gate for selection.

One or more of the folding circuits 7072 and 2727 may be used, if desired, in connection with a multi-bit first stage followed by a delay-to-digital converter, which is the configuration illustrated, by way of example, in FIG. 1. However, the present disclosure should not be limited to the illustrated configuration. For example, the present disclosure may be implemented without a multi-bit first stage. If desired, folded signals may be transmitted to a single-bit delay-to-digital converter or a multi-bit delay-to-digital converter. In the case of a single-bit delay-to-digital converter, then the signals on lines 74 and 76 may be applied directly to lines 50 and 52, without any signal processing between lines 74 and 76 and lines 50 and 52.

Returning now to FIG. 1, the folded signals on lines 74 and 76 are applied directly, with no delay offset and no modulation, to first and second inputs of a first delay comparator 78. The comparator 78 issues a first comparator signal SIGN1O to a digital processor (not shown), and issues a residue signal DELAY1O on line 96. One of the reasons why the folded signals on lines 74 and 76 are applied directly to the first delay comparator 78 is to avoid any loss of gain in the signals on lines 74 and 76. In this context, "loss of gain" means loss of delay. At the same time, the folded signals on lines 74 and 76 are modulated by second OR and AND gates 80 and 82, which generate NEG and POS signals, respectively. The timing of the NEG signal corresponds to that of the earlier arriving of the folded signals on lines 74 and 76, whereas the timing of the POS signal corresponds to the later arriving of the folded signals on lines 74 and 76.

The NEG signal is applied to three different delay elements 84, 86 and 88 which delay the timing of the NEG signal by different delay offsets ($D_o/3$, $2D_o/3$ and $D_o$), before the NEG signal is applied to first inputs of respective second, third, and fourth delay comparators 90, 92 and 94, where $D_o$ is the inherent delay of any one of the preamplifiers 34, 36, 38 or 40 when that preamplifier 34, 36, 38 or 40 is saturated. The application of the delay offsets ($D_o/3$, $2D_o/3$ and $D_o$) to the second, third and fourth comparators 90, 92 and 94, while applying no delay offset (0) to the first comparator 78, is similar to the application of voltage offsets in a conventional voltage-based flash circuit. However, any error due to noise or offset in the conventional flash circuit may cause the wrong zone to be determined, and may cause the back end of the system to compound the error by up to two times.

In the illustrated example, as noted above, the values of the delay offsets applied to the first, second, third and fourth comparators 78, 90, 92 and 94 are 0, $D_o/3$, $2D_o/3$ and $D_o$, respectively. In general, however, the values of delay offsets applied to the second and third comparators 90 and 92 may be B and C, respectively, where $0<B<C<D_o$. Moreover, other suitable configurations may be employed; the present disclosure is not limited to the example configurations described herein.

Figure 6:
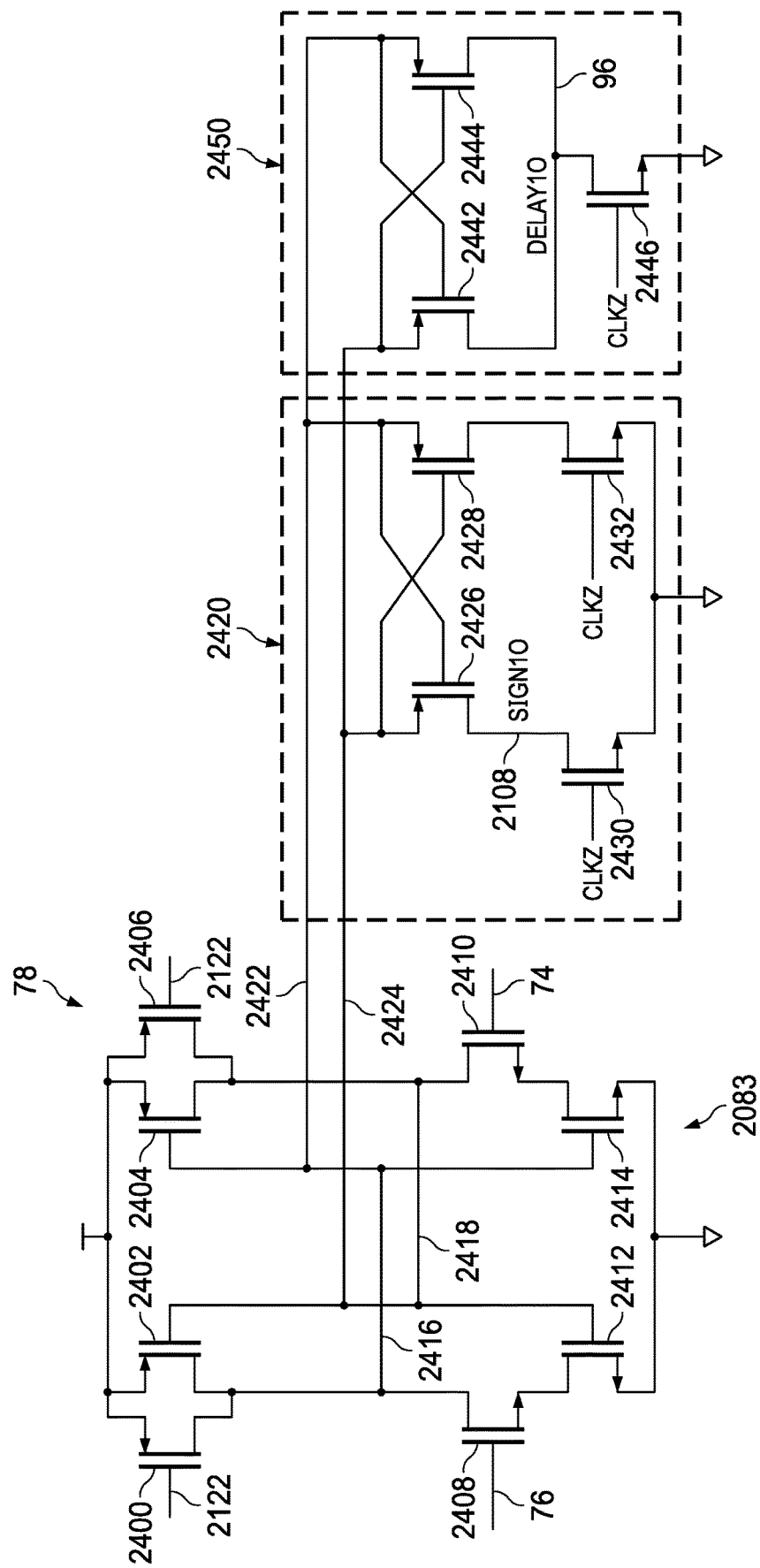
FIG. 6 is a circuit diagram of a delay comparator for the analog-to-digital converter systems of FIGS. 1 and 3.

The POS signal is applied to second inputs of the second, third and fourth comparators 90, 92 and 94. The second, third and fourth comparators 90, 92 and 94 issue respective second, third and fourth comparator signals SIGN2O, SIGN3O and SIGN4O to the digital processor, and issue respective residue signals DELAY2O, DELAY3O and DELAY4O on lines 98, 100 and 102. If desired, the delay comparators 78, 90, 92 and 94 shown in FIG. 1 may be constructed as illustrated in FIG. 6.

However, the delay comparators 78, 90, 92 and 94 of the illustrated configuration are not necessarily identical to each other. If desired, the comparators 78, 90, 92 and 94 may generate different delays to appropriately align the delays of the residue signals DELAY1O, DELAY2O, DELAY3O and DELAY4O that are applied to respective third AND gates 110 and 112. Also, in another embodiment, the comparators 78, 90, 92 and 94 may be identical to each other, but the AND gates 110 and 112 may be different to accommodate misalignment of the delays of the residue signals DELAY1O, DELAY2O, DELAY3O and DELAY4O.

In the example illustrated in FIG. 1, as noted above, the first delay-to-digital circuit 7890 has four comparators 78, 90, 92 and 94, while the first folding circuit 7072 receives signals from two preamplifiers 34 and 38. In general, however, the number of comparators may be independent of the number of preamplifiers. If the number of comparators is less than or more than four, then corresponding changes may be made to the folding circuitry which receives the residual signals from the comparators, so that the delay-to-digital circuit generates the two desired outputs on lines 50 and 52. Likewise, if the number of preamplifiers associated with the first folding circuit is less than or more than two, then corresponding changes may be made to the first folding circuit 7072, so that the folding circuit generates the two desired outputs on lines 74 and 76.

According to a preferred aspect of the present disclosure, one or more AND and OR gates, or other logic gates, are preferably memoryless logic gates, to improve the speed of the system 10.

Returning again to FIG. 1 of the present disclosure, the residue signals DELAY1O, DELAY2O, DELAY3O and DELAY4O are applied to the third AND gates 110 and 112 on lines 96, 98, 100 and 102 in such a way as to cause the timing of the output of the first one of the third AND gates 110, on line 50, to correspond to that of the later arriving of the first and third residue signals DELAY1O and DELAY3O, while the timing of the output of the second one of the third AND gates 112, on line 52, corresponds to that of the later arriving of the second and fourth residue signals DELAY2O and DELAY4O. The AND gates 110 and 112 constitute a folding circuit for the first delay-to-digital circuit 7890 (which is an example of a multibit stage).

Figures 2, 7:
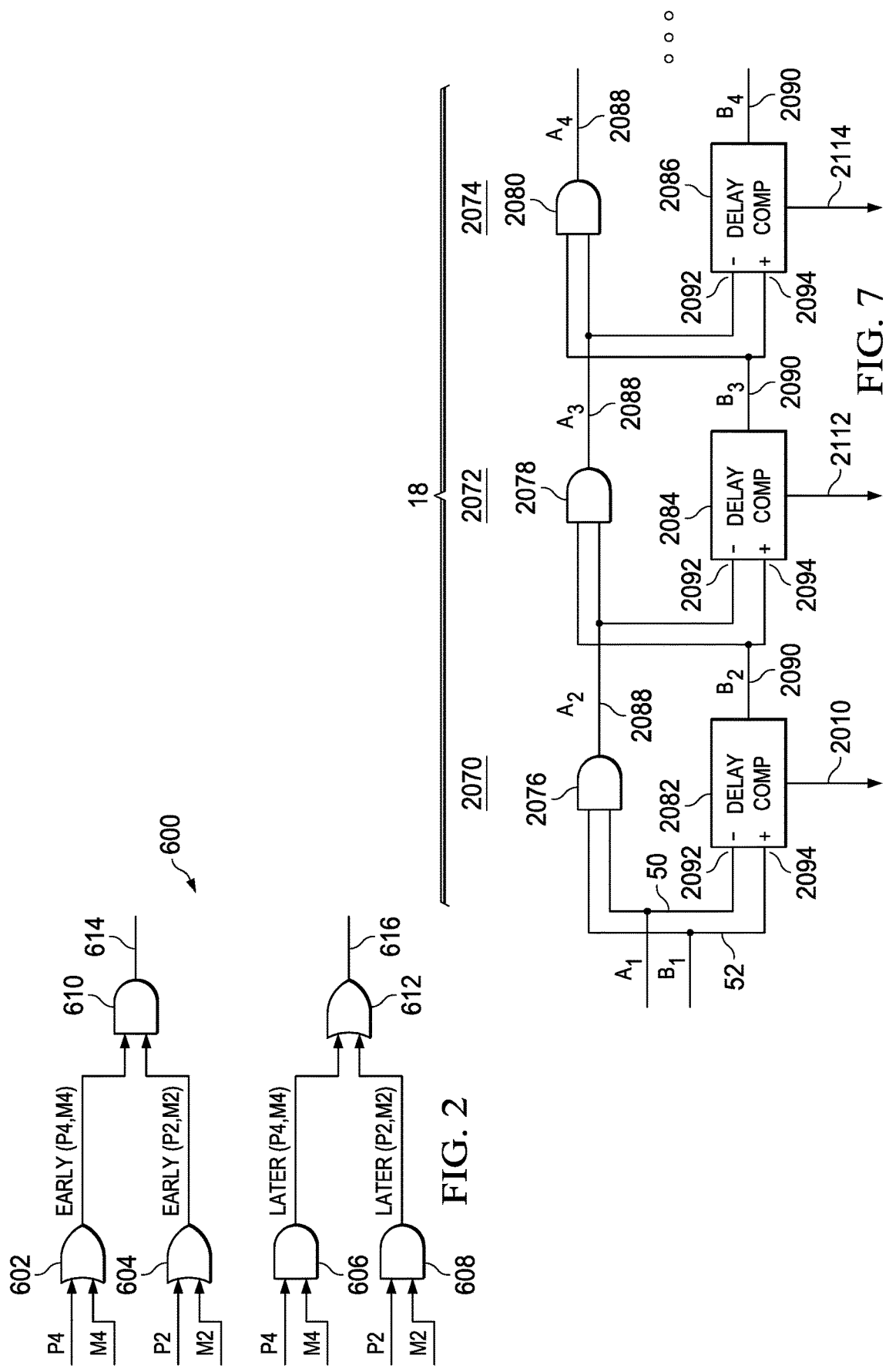
FIG. 2 is a block diagram of a selection circuit.
FIG. 7 is a block diagram of a delay-to-digital converter for the analog-to-digital converter system of FIG. 1.

The first, second, third and fourth comparator signals SIGN1O, SIGN2O, SIGN3O and SIGN4O are transmitted to the digital processor and may be used therein to determine one or more of the most significant bits of the digital code C1. Less significant bits of the same digital code C1 may be resolved within the first delay-to-digital converter 18, based on the residue delay information on lines 50 and 52. If desired, the first delay-to-digital converter 18 may be constructed as illustrated in FIG. 7.

In the example illustrated in FIG. 1, the third AND gates 110 and 112 form a delay folding stage. If there are two residue signals from the four comparators 78, 90, 92 and 94 whose timings are closest to each other, those signals will have the greatest delay, they will come from adjacent comparators, and the folding stage 110 and 112 will select that pair. Thus, the illustrated system 10 is configured to choose the two most-delayed signals from among the four residue signals DELAY1O, DELAY2O, DELAY3O and DELAY4O, because those two signals have the desired information, since the other signals come from a preamplifier whose threshold is far from the input voltage Vin. The timings of residue signals DELAY1O and DELAY2O may be close to each other, and the timings of residue signals DELAY3O and DELAY4O may be close to each other, but which comes later is important. The timings of the outputs (50 and 52) of the third AND gates 110 and 112 will be based on the timings of the later-arriving of the signals applied to the AND gates 110 and 112.

On the other hand, if one residue signal from the four delay comparators 78, 90, 92 and 94 has a materially greater delay than the other three, then that signal will determine the output delay of the AND gate (110 or 112) to which that signal is applied. For example, if the POS signal is near $D_o/3$, then the first one of the third AND gates 110 will be folding (timing of DELAY1O=timing of DELAY3O), but the second residue signal DELAY2O will have a high gain (higher delay), because the timings of the two inputs to the second delay comparator 90 are close to each other. The operation of delay comparators constructed in accordance with the present disclosure are explained below in connection with FIGS. 6 and 7.

In the system 10 illustrated in FIG. 1, the signals output by the even preamplifiers 36 and 40 are processed by the second folding circuit 2727 as follows: The second delay signal P4 of the fourth preamplifier 40 is applied to a first input of a first OR gate 270, the first delay signal M2 of the second preamplifier 36 is applied to the second input of the first OR gate 270, the first signal M4 of the fourth preamplifier 40 is applied to the first input of a first AND gate 272, and the second signal P2 of the second preamplifier 36 is applied to the second input of the first AND gate 272. As is the case for the odd portion of the system 10, for any input voltage Vin, neither the OR gate 270 nor the AND gate 272 receives two delay signals from a single preamplifier.

The even portion of the system 10 may be constructed and operated the same as the odd portion discussed above. In operation, the signal outputted by the first OR gate 270, on line 274, corresponds to that of the earlier arriving of the second signal P4 of the fourth preamplifier 40 and the first signal M2 of the second preamplifier 36. The timing of the signal outputted by the first AND gate 272, on line 276, corresponds to that of the later arriving of the first signal M4 of the fourth preamplifier 40 and the second signal P2 of the second preamplifier 36.

The folded signals on lines 274 and 276 are applied directly, with no delay offset and no modulation, to first and second inputs of a first delay comparator 278. The comparator 278 issues a first comparator signal SIGN1E to the digital processor, and issues a residue signal DELAY1E on line 296. At the same time, the folded signals on lines 274 and 276 are modulated by second OR and AND gates 280 and 282, which generate NEG and POS signals, respectively. The timing of the NEG signal corresponds to that of the earlier arriving of the folded signals on lines 274 and 276, whereas the timing of the POS signal corresponds to the later arriving of the signals on lines 274 and 276. In the illustrated configuration, the NEG signal is applied to three different delay elements 284, 286 and 288 which delay the timing of the NEG signal by applying different delay offsets ($D_o/3$, $2D_o/3$ and $D_o$) before the NEG signal is applied to first inputs of respective second, third and fourth delay comparators 290, 292 and 294.

The operation of the selection logic for the even side of the system 10, for certain illustrative scenarios, is summarized in Table 2 below. The even side of the system 10 processes delay signals from the second and fourth preamplifiers 36 and 40. In a first illustrative scenario, the input voltage Vin is greater than the second threshold voltage TH2, but closer to the second threshold voltage TH2 than to the fourth threshold voltage TH4, such that signals P2 and M4 precede signals M2 and P4, signal P2 is the later of signals P2 and M4, and signal M2 is the earlier of signals M2 and P4. In the first illustrative scenario, signals M2 and P2 are transmitted on lines 274 and 276, respectively, directly to the first delay comparator 278 to avoid gain loss, while signal P2, which is the earlier of signals M2 and P2, is transmitted by the second OR gate 280 (as the NEG signal), and signal M2, which is the later of signals M2 and P2, is transmitted by the second AND gate 282 (as the POS signal).

TABLE 2

| Signal Location | Early Edges | Later Edges |
|---|---|---|
| Above TH2 and near TH2 | P2,M4: P2 later | M2,P4: M2 earlier |
| Below TH4 and near TH4 | P2,M4: M4 later | M2,P4: P4 earlier |
| Above TH4 | P4,P2: P4 later | M4,M2: M4 earlier |
| Below TH2 | M2,M4: M2 later | P2,P4: P2 earlier |

Still referring to Table 2, in a second illustrative scenario, the input voltage Vin is less than the fourth threshold voltage TH4, but closer to the fourth threshold voltage TH4 than to the second threshold voltage TH2, such that signals P2 and M4 precede signals M2 and P4, signal M4 is the later of signals P2 and M4, and signal P4 is the earlier of signals M2 and P4. In the second illustrative scenario, signals P4 and M4 are transmitted on lines 274 and 276, respectively, directly to the first delay comparator 278 to avoid gain loss, while signal M4 (the earlier of signals M4 and P4) is transmitted by the second OR gate 280 (as the NEG signal), and signal P4 (the later of signals M4 and P4) is transmitted by the second AND gate 282 (as the POS signal).

Still referring to Table 2, in a third illustrative scenario, the input voltage Vin is greater than the fourth threshold voltage TH4, such that signals P4 and P2 precede signals M4 and M2, signal P4 is the later of signals P4 and P2, and signal M4 is the earlier of signals M4 and M2. In the third illustrative scenario, signals P4 and M4 are transmitted on lines 274 and 276, respectively, directly to the first delay comparator 278 to avoid gain loss, while signal P4 (the earlier of signals P4 and M4) is transmitted by the second OR gate 280 as the NEG signal, and signal M4 (the later of signals P4 and M4) is transmitted by the second AND gate 282 as the POS signal.

Finally, still referring to Table 2, in a fourth illustrative scenario, input voltage Vin is less than the second threshold voltage TH2, such that signals M2 and M4 precede signals P2 and P4, signal M2 is the later of signals M2 and M4, and signal P2 is the earlier of signals P2 and P4. In the fourth illustrative scenario, signals M2 and P2 are transmitted on lines 274 and 276, respectively, directly to the first delay comparator 278 to avoid gain loss, while signal M2 (the earlier of signals M2 and P2) is transmitted by the second OR gate 280 as the NEG signal, and signal P2 (the later of signals M2 and P2) is transmitted by the second AND gate 282 as the POS signal.

For purposes of comparison, FIG. 2 shows a selection logic circuit 600 which has first OR gates 602 and 604, first AND gates 606 and 608, a second AND gate 610, and a second OR gate 612. The logic circuit 600 may be used, with the even preamplifiers 36 and 40, to output, on line 614, the later of the earlier of signals M2 and P2 and M4 and P4, and to output, on line 616, the earlier of the later of signals M2 and P2 and M4 and P4. Although the logic circuit 600 may be used to select signals to be transmitted on lines 614 and 616 that are relevant to determining the input voltage Vin, the circuit 600 may experience a loss of gain because signals input into any one of the first OR and AND gates 602, 604, 606 and 608 come from the same, respective preamplifier. The system 10 illustrated in FIG. 1 may avoid such a loss of gain by ensuring that none of the gates 70, 72, 270 and 274 of the first and second folding circuits 7072 and 2727 receives signals from the same preamplifier.

Returning now to FIG. 1, the POS signal is applied to second inputs of the second, third and fourth comparators 290, 292 and 294, which issue respective second, third and fourth comparator signals SIGN2E, SIGN3E and SIGN4E to the digital processor, and respective residue signals DELAY2E, DELAY3E and DELAY4E on lines 298, 300 and 302. If desired, the delay comparators 278, 290, 292 and 294 may be constructed like the delay comparator 78 illustrated in FIG. 6. Likewise, the delay comparators 90, 92 and 94 may be constructed like the delay comparator illustrated in FIG. 6

As illustrated in FIG. 1, the residue signals DELAY1E, DELAY2E, DELAY3E and DELAY4E are applied, on lines 296, 298, 300 and 302, to third AND gates 310 and 312 in a folding manner, to cause the timing of the output of the first one of the third AND gates 310, on line 54, to correspond to that of the later arriving of the first and third residue signals DELAY1E and DELAY3E, while the timing of the second one of the third AND gates 312, on line 56, corresponds to that of the later arriving of the second and fourth residue signals DELAY2E and DELAY4E.

Still referring to the even portion of the system 10, the first, second, third and fourth comparator signals SIGN1E, SIGN2E, SIGN3E and SIGN4E are transmitted to the digital processor and may be used therein to determine one or more of the most significant bits of the digital code C2. Less significant bits of the same digital code C2 may be resolved within the second delay-to-digital converter 20 based on the residue delay information on lines 54 and 56. If desired, the second delay-to-digital converter 20 may be constructed like the first delay-to-digital converter 18 and it may be constructed as illustrated in FIG. 7.

As mentioned above, the selection circuit 2224 includes the comparator 22 and the multiplexer 24. The comparator 22 determines which one of the first and second digital codes C1, C2, from the first and second delay-to-digital converters 18 and 20, has the lower value, and causes the multiplexer 24 to transmit the digital code C1 or C2 which has the lower value to the adder circuit 30. The digital information output by the multiplexer 24 is the digital code C1 or C2 which has the lesser value. As a result, the delay information that is ultimately reflected in the digital output code C corresponds to the lower value output by the first and second delay-to-digital converters 18 and 20 for any given value of the input voltage Vin. A suitable structure for selecting an output from one of odd/even delay-to-digital converters which receive delay information from odd/even preamplifiers, is described in U.S. Pat. No. 10,673,456. The selection circuit 2224 may be used in connection with parallel processing of odd/even delay signals to avoid an inaccurate result that could otherwise be caused by saturation, such that the selected output applied to the adder circuit 30 is more representative of the input voltage Vin.

An important aspect of the present disclosure is that the system 10 illustrated in FIG. 1 is configured to choose certain signals, which should be applied to OR/AND gates, so that those signals may be processed by those OR/AND gates without loss of gain. An example of such a choice is illustrated by the manner in which the first and second delay signals M4 and P4 from the fourth preamplifier 40 are not transmitted to the same gate, but instead are transmitted to different gates 272 and 270.

Another important aspect of the present disclosure is that signals from odd and even preamplifiers may be processed separately. In the configuration illustrated in FIG. 1, two delay-to-digital converters 18 and 20 may be used to process signals from odd and even portions of the system 10. The present disclosure is not limited, however, to the illustrated configuration.

Further, as mentioned above, the unfolding circuit 2628 illustrated in FIG. 1 may include the auxiliary comparator 26, the zone detector 28, and the adder circuit 30. Since the auxiliary comparator 26 receives signals that carry data as a function of delay (and not a voltage level), such as second and first delay signals P3 and M2, and outputs a comparator signal SIGN_AUXILIARY in response, the performance of auxiliary comparator 26 can be worse and it is not as susceptible to noise-related errors. The zone detector 28 receives the comparator signal SIGN_AUXILIARY and the first comparator signals SIGN1O and SIGN1E, each of which is a digital signal with a value of 1 or 0. The use of the noisy, coarse comparator 26 is an important aspect of the present disclosure.

The zone detector 28 compares the received digital information to the keys provided in columns 404, 406 (FIG. 1) to determine the zone (voltage range) within which the input voltage Vin is located, where column 404 provides the key to the crude comparator signal SIGN_AUXILIARY, and column 406 provides the key to matched sets of the first comparator signals SIGN1E and SIGN1O, respectively. For example, if SIGN1E and SIGN1O are 1 and 0, respectively, then Vin is between $TH_4$ and $TH_3$. If SIGN1E and SIGN1O are 0 and 0, respectively, and SIGN_AUXILIARY is 1, then Vin is greater than $TH_4$. If SIGN1E and SIGN1O are 0 and 0, respectively, and SIGN_AUXILIARY is 0, then Vin is less than $TH_1$.

In operation, the zone detector 28, working with the adder circuit 30, causes the signal (C1 or C2) chosen and output by the multiplexer 24 to be inverted, and then adds an offset to the inverted signal based on SIGN1O, SIGN1E and SIGN_AUXILIARY. Thus, according to the present disclosure, the output of the zone detector 28 may be based on (1) back-end delay comparators 78 and 278 and (2) a non-critical delay comparator 26 connected directly to preamplifier outputs P3 and M2, instead of relying on a flash circuit which operates directly on an input voltage. The output of the adder circuit 30, which is the digital output code C, reflects (1) the zone (voltage range) within which the input voltage Vin is located and (2) resolution of the voltage Vin within that zone. Determination of the zone (voltage range) is described below in connection with columns 404 and 406. Resolution of the voltage Vin within its zone is performed by the respective one of the delay-to-digital converters.

The delay-based analog-to-digital converter system 10 illustrated in FIG. 1 is configured to provide folding of a preamplifier-stage output M1, M2, M3, M4, P1, P2, P3 and P4 ahead of any modulus stage. Two outputs from any single preamplifier 34, 36, 38 or 40 do not go to any single logic gate 70, 72, 270 or 272, or directly to any single delay comparator 26. Instead, input is fed to some delay comparators 78 and 278 before any modulus stage, whereas output from a modulus stage 80, 82, 280 and 282 is output to other delay comparators 90, 92, 94, 290, 292 and 294. Preamplifier outputs P3 and M2 may be transmitted to at least one delay comparator 26 directly, without any modulus or folding. An advantage of the present disclosure is that a flash circuit may not be required for zone selection. Digital bits SIGN1O and SIGN1E from the back end 78 and 278 of the system 10, and from a coarse comparator 26 working directly on preamplifier outputs P3 and M2, are supplied to a zone detector 28 to unfold a selected output from at least two delay-to-digital converters 18 and 20.

In another example configuration (not illustrated), a voltage-to-delay converter (or, preamplifier frontend) may have fifth and sixth preamplifiers in addition to the four preamplifiers 34, 36, 38 and 40 illustrated in FIG. 1. The threshold voltage of the fifth preamplifier may between the threshold voltages $TH_2$ and $TH_3$ of the second and third preamplifiers 36 and 38, and the threshold voltage of the sixth preamplifier may be greater than the threshold voltage $TH_4$ of the fourth preamplifier 40. Delay information developed by the fifth and sixth preamplifiers may be processed separately from, and parallel to, the delay information developed by the first and third preamplifiers 34 and 38, and separately from, and parallel to, the delay information developed from the second and fourth preamplifiers 36 and 40.

Outputs of the fifth and sixth preamplifiers may be applied to a third folding circuit similar to the first and second folding circuits 7072 and 2727, the outputs of the third folding circuit may be applied to third delay-to-digital circuits similar to the first and second delay-to-digital circuits 7890, 18, 2729 and 20, and an output code may be derived from the outputs of the first, second and third delay-to-digital circuits. In this example configuration, the six preamplifiers and the three folding circuits may be constructed such that no folding circuit receives outputs from adjacent preamplifiers, and processing loss may be avoided by ensuring that critical delay signals do not go through the same logic gate. Preferably, no logic gate of any of the folding circuits receives two signals from a single preamplifier.

Figure 3:
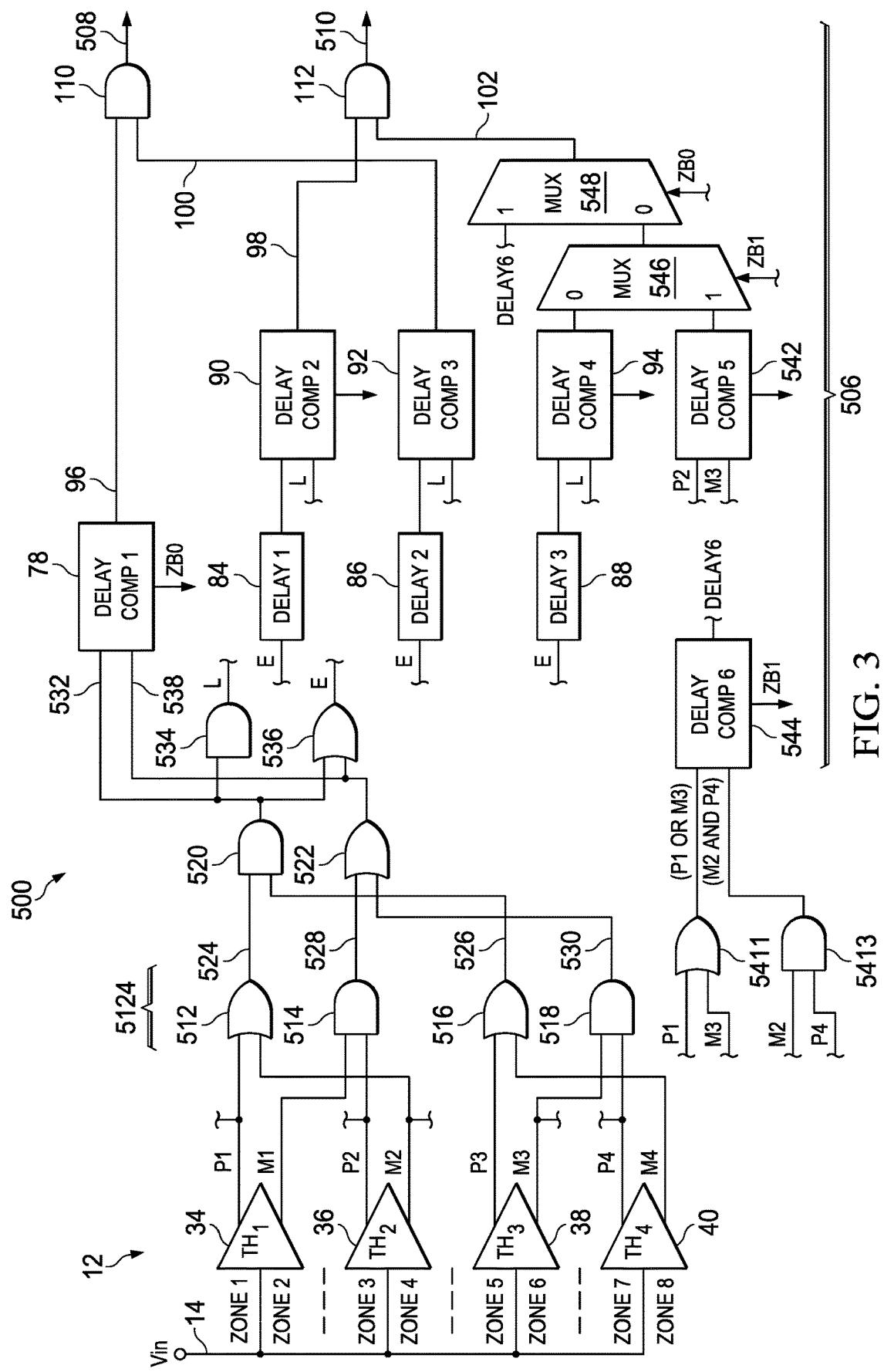
FIG. 3 is a block diagram of another example of an analog-to-digital converter system constructed in accordance with the present disclosure.

FIG. 3 illustrates a delay-based analog-to-digital converter system 500 constructed in accordance with another aspect of the present disclosure. In the FIG. 3 configuration, no two critical signals go to the same logic gate. The illustrated system 500 has a voltage-to-delay converter 12 for receiving voltages Vin on an input line 14, and a conversion and folding circuit 506 for processing delay signals P1, M1, P2, M2, P3, M3, P4 and M4 generated by the voltage-to-delay converter 12. An important aspect of the system 500 is that it is configured to operate with only a single back end. That is, the system 500 is configured to generate delay signals on lines 508 and 510 that can be resolved by a single delay-based delay-to-digital converter (not shown). In operation, digital codes generated by the single delay-based delay-to-digital converter may be representative of the corresponding voltages Vin on the input line 14.

At least the voltage-to-delay converter 12 and the conversion and folding circuit 506 may be integrated into an integrated circuit (IC) and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates, and other suitable electronic devices that are not shown in the drawings for the sake of clarity. As noted above, the present disclosure is not limited to the details and specific features of the examples shown in the drawings and otherwise described herein.

As illustrated in FIG. 3, the second output P1 of the first preamplifier 34 is applied to the first input of a first OR gate 512, the first output M2 of the second preamplifier 36 is applied to the second input of the first OR gate 512, the first output M1 of the first preamplifier 34 is applied to the first input of a first AND gate 514, and the second output P2 of the second preamplifier 36 is applied to the second input of the first AND gate 514. The second output P3 of the third preamplifier 38 is applied to the first input of a second OR gate 516, the first output M4 of the fourth preamplifier 40 is applied to the second input of the second OR gate 516, the first output M3 of the third preamplifier 38 is applied to the first input of a second AND gate 518, and the second output P4 of the fourth preamplifier 40 is applied to the second input of the second AND gate 518. For any sampled input voltage Vin, none of the first and second OR and AND gates 512, 514, 516 and 518 receives two delay signals from a single preamplifier.

In the configuration illustrated in FIG. 3, the first and second OR (512 and 516) and AND gates (514 and 518) are elements of a first folding stage 5124. After the first folding stage 5124, the output of the first OR gate 512, whose timing corresponds to the earlier arriving of delay signals P1 and M2, is applied to the first input of a third AND gate 520, on line 524, while the output of the second OR gate 516 is applied to the second input of the third AND gate 520, on line 526. The output of the first AND gate 514, whose timing corresponds to the later arriving of delay signals M1 and P2, is applied to the first input of a third OR gate 522, on line 528, while the output of the second AND gate 518 is applied to the second input of the third OR gate 522, on line 530.

The output of the third AND gate 520, on line 532, reflects the timing of the later arriving of the earlier arriving of delay signals P1, M2, P3 and M4, and is applied to the first inputs of fourth AND and OR gates 534 and 536 and the first input of a first delay comparator 78. The output of the third OR gate 522, on line 538, reflects the timing of the earlier arriving of the later arriving of delay signals M1, P2, M3 and P4, and is applied to the second inputs of the fourth AND and OR gates 534 and 536 and the second input of the first delay comparator 78.

The fourth AND and OR gates 534 and 536 issue late and early signals L and E, respectively. The early signal E is applied to three different delay elements 84, 86 and 88 (with respective delays of $D_o/3$, $2D_o/3$ and $D_o$), and thereafter applied to the first inputs of second, third, and fourth delay comparators 90, 92 and 94, respectively. The late signal L is applied to the second inputs of the second, third, and fourth delay comparators 90, 92 and 94. The delay residue signals output by the first, second, and third delay comparators 78, 90 and 92 are applied to residue AND gates 110 and 112 on lines 96, 98 and 100 in a configuration similar to what is illustrated in FIG. 1 in connection with the ODD portion of the conversion and folding circuit 16.

In the configuration illustrated in FIG. 3, the second delay signal P2 output by the second preamplifier 36 is applied directly to the first input of a fifth delay comparator 542, while the first delay signal M3 of the third preamplifier 38 is applied directly to the second input of the fifth comparator 542.

The earlier arriving of the second delay signal P1 output by the first preamplifier 34 and the first delay signal M3 output by the third preamplifier 38 is applied to the first input of a sixth delay comparator 544. The later arriving of the first delay signal M2 output by the second preamplifier 36 and the second delay signal P4 output by the fourth preamplifier 40 is applied to the second input of the sixth comparator 544.

The second input to the second residue AND gate 112, on line 102, is supplied by a two-stage multiplexer circuit which has first and second serially-connected multiplexers 546 and 548. The selector input ZB1 for the first multiplexer 546 is generated by the sixth delay comparator 544. The selector input ZB0 for the second multiplexer 548 is generated by the first delay comparator 78. Thus, the residual delay signal from the fourth comparator 94 is exclusively applied to the second residue AND gate 112, on line 102, when the digital outputs ZB0 and ZB1 of the first and sixth comparators 78, 544 are both low (0).

The residual delay signal from the fifth comparator 542 is exclusively applied to the second residue AND gate 112 on line 102 when the digital outputs ZB0 and ZB1 of the first and sixth comparators 78 and 544 are high (1) and low (0), respectively. The residual delay signal Delay6 from the sixth comparator 544 is exclusively applied on line 102 to the second residue gate 112 whenever the digital output ZB0 of the first comparator 78 is high (1).

As illustrated in FIG. 3, the input voltage Vin may be in any one of eight voltage zones (that is, Zones 1, 2, 3 . . . 8). At the points where the input voltage Vin transitions between Zones 1 and 2, Zones 3 and 4, Zones 5 and 6 and Zones 7 and 8, the input voltage Vin is $TH_1$, $TH_2$, $TH_3$ and $TH_4$ (e.g. the reference voltages applied to pre-amplifiers 34, 36, 38 or 40), respectively, and the delay comparator that forwards the most relevant residue delay information to the delay-based delay-to-digital converter (not shown in FIG. 3), on line 508, is the first delay comparator 78. When the input voltage Vin is $TH_1$, $TH_2$, $TH_3$ or $TH_4$, the fourth AND and OR gates 534 and 536 have zero gain, that is, there is no difference in timing between the late and early signals L and E. In the configuration illustrated in FIG. 3, when the input voltage Vin is $TH_1$, $TH_2$, $TH_3$ or $TH_4$, the timings of signals on lines 532 and 538 are the same, such that the timings of the late and early signals L and E are the same. Further, when the input voltage Vin is $TH_1$, $TH_2$, $TH_3$ or $TH_4$, the digital output ZB0 from the first delay comparator 78 is metastable (that is, in an undetermined state), because the timings of the signals on lines 532 and 538 are the same, such that there is no timely signal on line 102. A delay comparator constructed in accordance with the present disclosure may be metastable when the timings of the two signals applied to the delay comparator are equal to, or close to, each other.

In operation, if the delay signal applied to the first input of a delay comparator precedes the delay signal applied to the second input of the delay comparator, then the bit output from the delay comparator is high (1). ZB0 is the bit output of the first delay comparator 78, and ZB1 is the bit output of the sixth comparator 544. With these connections, each node functionality can be defined. For example, the signal on line 524 (selected by OR gate 512) is the earlier-arriving of P1 and M2, and ZB0 is high (1) if the signal on line 532 is more delayed than the signal on line 538. By way of another example, if the input voltage Vin is in Zone 1, then the sequence of signals from the preamplifiers 34, 36, 38 and 40, from earliest to latest is as follows: P4, P3, P2, P1, M1, M2, M3 and M4, and lines 524, 528, 526, 530, 533 and 538 reflect the timing of signals P1, M1, P3, M3, P1 and M1, respectively, the earlier of P1 and M3 is P1, the later of M2 and P4 is M2, and ZB0 and ZB1 are both high (1). In FIG. 3, the term "P1 OR M3" means the result of processing signals P1 and M3 through an OR gate 5411 (or other suitable logic device) such that the earlier of signals P1 and M3 is applied to the sixth delay comparator 544. And the term "M2 AND P4" means the result of processing signals M2 and P4 through an AND gate 5413 (or other suitable logic device) such that the later of signals M2 and P4 is applied to the sixth delay comparator 544.

At the points where the input voltage Vin transitions between Zones 2 and 3 and Zones 6 and 7, the input voltage Vin is $(TH_1+TH_2)/2$ and $(TH_3+TH_4)/2$, respectively, and the delay comparator that forwards the most relevant residue delay information to the delay-based delay-to-digital converter, on line 510, is the sixth delay comparator 544. When the input voltage Vin is $(TH_1+TH_2)/2$, the first OR and AND gates 512 and 514 have zero gain. The digital output ZB0 from the first delay comparator 78 is high (1) such that the residue delay signal Delay6 from the sixth delay comparator 544 is applied to the second residue gate 112, through the second multiplexer 548. When the input voltage Vin is $(TH_3+TH_4)/2$, the second OR and AND gates 516 and 518 have zero gain, and the digital output ZB0 from the first delay comparator 78 is high (1) such that the residue delay signal Delay6 from the sixth comparator 544 is applied to the second residue gate 112.

At the point where the input voltage Vin transitions between Zones 4 and 5, the input voltage Vin is $(TH_2+TH_3)/2$, and the delay comparator that forwards the most relevant residue delay information to the delay-to-digital converter, on line 510, is the fifth delay comparator 542. When the input voltage Vin is $(TH_2+TH_3)/2$, the third AND and OR gates 520 and 522 have zero gain. The digital outputs ZB0 and ZB1 of the first and sixth comparators 78 and 544 are low (0) and high (1), respectively, such that a path is provided through the multi-stage multiplexer circuit 546 and 548 from the fifth comparator 542 to the second residue AND gate 112.

In summary, the system 500 illustrated in FIG. 3 provides a path through a relevant delay comparator even when the input voltage Vin is at one of the above-mentioned transitions, where some of the logic gates may have zero gain. The transition conditions are summarized in Table 3 below.

TABLE 3

| Transition | Relevant comparator | Zero gain folding gates | ZB0 | ZB1 |
|---|---|---|---|---|
| 1 to 2 | Comp 1 | 534, 536 | metastable | 0 |
| 2 to 3 | Comp 6 | 512, 514 | 1 | metastable |
| 3 to 4 | Comp 1 | 534, 536 | metastable | 1 |
| 4 to 5 | Comp 5 | 520, 522 | 0 | 1 |
| 5 to 6 | Comp 1 | 534, 536 | metastable | 1 |
| 6 to 7 | Comp 6 | 516, 518 | 1 | metastable |
| 7 to 8 | Comp 1 | 534, 536 | metastable | 0 |

One or more of the digital outputs of the first through sixth comparators 78, 90, 92, 94, 542 and 546 may be transmitted to a digital processor (not illustrated) and used therein to determine one or more of the most significant bits of the digital output code. Less significant bits of the same digital code may be resolved within the single delay-to-digital converter which receives residue delay information on lines 508, 510.

Figures 4, 5:
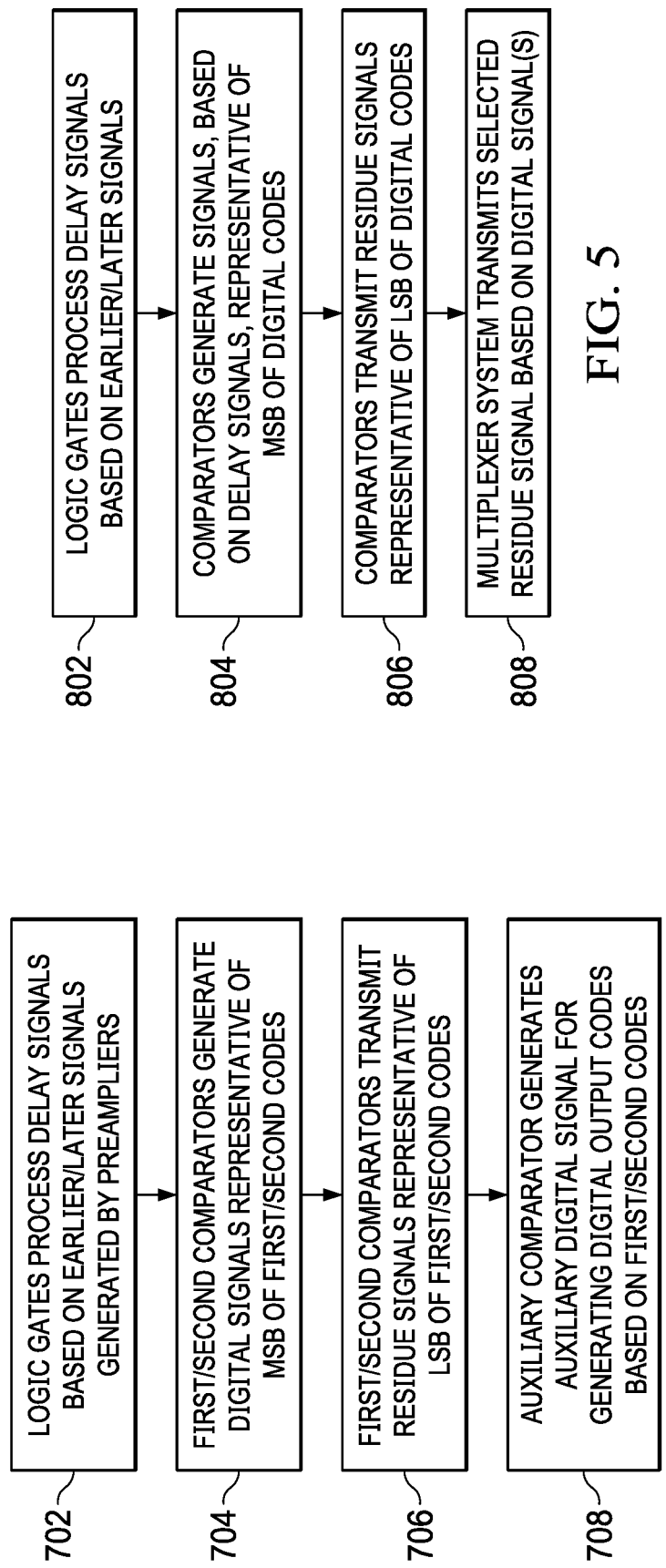
FIG. 4 is a flow chart for a method of operating the analog-to-digital converter system of FIG. 1.
FIG. 5 is a flow chart for a method of operating the analog-to-digital converter system of FIG. 3.

FIG. 4 illustrates a method of using the system 10 shown in FIG. 1 to convert the input voltage Vin into digital output codes C. The method may include the steps of causing logic gates 70, 72, 270 and 272 to process delay signals based on earlier and later arriving signals generated by preamplifiers 34, 36, 38 and 40 (Step 702), causing first delay comparators 78, 90, 92 and 94 and second delay comparators 278, 280, 282 and 284 to generate digital signals SIGN1O, SIGN2O, SIGN3O, SIGN4O, SIGN1E, SIGN2E, SIGN3E and SIGN4E representative of most significant bits (MSB) of respective first and second digital codes C1 and C2 (Step 704), and to transmit delay residue signals DELAY1O, DELAY2O, DELAY3O, DELAY4O, DELAY1E, DELAY2E, DELAY3E and DELAY4E representative of less significant bits (LSB) of the first and second digital codes C1 and C2 (Step 706), and causing an auxiliary delay comparator 26 to generate an auxiliary digital signal SIGN_AUXILIARY for use in generating the digital output codes C based on the first and second digital codes C1 and C2 (Step 708).

If desired, the method may include causing delay-based delay-to-digital converters 18 and 20 to resolve the less significant bits of the first and second digital codes C1 and C2. The method may also include unfolding codes generated by one of the delay-to-digital converters 18 and 20, wherein the unfolding includes generating a zone selection signal (28) based on the auxiliary digital signal SIGN_AUXILIARY and digital signals SIGN1O and SIGN1E from the first and second delay comparators 78 and 278.

FIG. 5 illustrates a method of using the system 500 shown in FIG. 3 to generate output delay signals (508 and 510). The method may include the steps of causing logic gates to process delay signals based on earlier and later arriving signals (Step 802), causing delay comparators to generate digital signals, based on the delay signals, representative of most significant bits of respective digital codes (Step 804), and to transmit delay residue signals representative of less significant bits of the digital codes (Step 806), and using a multiplexer system 546 and 548, connected to the delay comparators, to transmit (102) a selected one of the delay residue signals based on one or more of the digital signals (Step 808).

If desired, the logic gates used in the method of FIG. 5 may include multiple folding stages between the preamplifier array 12 and the delay comparators. If desired, the multiplexer system may include at least first and second, serially arranged multiplexers, the first multiplexer 546 receives a selector signal ZB1 from a first delay comparator 544, and the second multiplexer 548 receives a selector signal ZB0 from a second delay comparator 78.

FIG. 6 illustrates a delay comparator of an example embodiment. While the references in FIG. 6 apply to delay comparator 78, the delay comparator of FIG. 6 can be used to implement any of the delay comparators discussed herein (with some modification regarding the signals applied to the gates of transistors 2408 and 2410). The delay comparator 78 may have a comparator circuit 2083 which has first, second, third, fourth, fifth, sixth, seventh and eighth transistors 2400, 2402, 2404, 2406, 2408, 2410, 2412 and 2414. The timing of the delay comparator 78 may be controlled by a signal from a clock applied to the gates of the first and fourth transistors 2400 and 2406, on a conductive line 2122.

First and second signals on lines 74 and 76 are applied to the gates of the sixth and fifth transistors 2410 and 2408, respectively. The drains of the first, second and fifth transistors 2400, 2402 and 2408 are electrically connected to each other, and to the gates of the third and eighth transistors 2404 and 2414, via a first conductive line 2416. The drains of the third, fourth and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated in FIG. 6, the sign-out circuit 2420 is merged with the comparator circuit 2083. The sign-out circuit 2420 has first, second, third and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 78 is enabled by the clock signal on line 2122, a sign signal SIGN1O is generated within the sign-out circuit 2420 on line 2108. The sign signal is forwarded to a processor, and represents the order in which the first and second signals arrive at the inputs of the delay comparator 78 (on lines 74 and 76). The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2444 are also electrically connected to a delay-out circuit 2450. As illustrated in FIG. 6, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal DELAY1O is generated on line 96, which is electrically connected to the drains of both of the first and second transistors 2442 and 2444 of the delay-out circuit 2450. The timing of the leading edge of the delay signal DELAY1O on line 96 relative to the timing of the earlier-arriving of the leading edges of the signals on lines 74 and 76 is the comparator delay, which is described in more detail below in connection with FIG. 7. The operation of the delay-out circuit 2450 is controlled by the same inverted clock signal CLKZ that is applied to the third and fourth transistors 2430 and 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442 and 2444 of the delay-out circuit 2450.

The present disclosure should not be limited to the examples shown and described herein. For example, although the delay comparator 78 illustrated in FIG. 6 is operated under the control of a clock signal, one or more of the delay comparators for the system 10 illustrated in FIG. 1 may be operated in a clockless manner.

FIG. 7 illustrates a backend delay-to-digital converter (such as converter 18 and converter 20 of FIG. 1) of an example embodiment for the system 10. In the illustrated configuration, the delay-to-digital converter 18 has three or more stages 2070, 2072 and 2074, with respective AND gates 2076, 2078 and 2080 and delay comparators 2082, 2084 and 2086. Please note that the illustrated AND gates are merely examples of logic gates that may be employed according to this disclosure. If desired, this disclosure may be implemented with or without AND gates and/or with or without gates other than AND gates.

In the illustrated configuration, the second and third AND gates 2078 and 2080 are essentially identical to the first AND gate 2076, and the second and third delay comparators 2084 and 2086 are essentially identical to the first delay comparator 50. Conductive lines 50 and 52 (or 54 and 56 for converter 20) are both coupled to inputs of the first AND gate 2076. A first one of the conductive lines 50 is also coupled to a first input 2092 of the first delay comparator 2082, and the second one of the conductive lines 52 is coupled to a threshold input 2094 of the first delay comparator 2082. If desired, the first delay comparator 2082 may be constructed essentially the same as the delay comparator 78 illustrated in FIG. 6.

An output line 2088 from the first AND gate 2076 is electrically coupled to one of the inputs of the second AND gate 2078, and to the first input 2092 of the second delay comparator 2084. A conductive line 2090 from the first delay comparator 50 is electrically coupled to the other one of the inputs of the second AND gate 2078, and to the threshold input 2094 of the second delay comparator 2084. In like manner, an output line 2088 from the second AND gate 2078 is electrically coupled to one of the inputs of the third AND gate 2080, and to the first input 2092 of the third delay comparator 2086, and a conductive line 2090 from the second delay comparator 2084 is electrically coupled to the other one of the inputs of the third AND gate 2080, and to the threshold input 2094 of the third delay comparator 2086.

The pattern created by the second and third stages 2072 and 2074 may be continued, if desired, for a fourth stage or for as many additional stages as desired. Each successive stage has an AND gate and a delay comparator essentially identical to the AND gates 2078 and 2080 and the delay comparators 2084 and 2086 of the second and third stages 2072 and 2074, and electrically coupled to the AND gate and delay comparator of a preceding stage in the same way that the third AND gate 2080 and the third delay comparator 2086 are electrically coupled to the second AND gate 2078 and the second delay comparator 2084.

In operation, signals $A_N$, $B_N$ (where N=1, 2, 3 . . . for the first, second, third . . . stages 2070, 2072, 2074 . . . respectively) are applied to respective ones of the AND gates 2076, 2078 and 2080, causing the AND gates 2076, 2078 and 2080 to generate corresponding signals $A_{N+1}$. For each one of the AND gates 2076, 2078 and 2080, the timing of the leading edge of signal $A_{N+1}$ tracks the timing of the leading edge of the later-arriving of signals $A_N$ and $B_N$.

In particular, for each one of the AND gates 2076, 2078 and 2080, the timing of the leading edge of signal $A_{N+1}$ is equal to the timing of the leading edge of the earlier-arriving of signals $A_N$ and $B_N$ plus an amount of time that is related to the extent to which the leading edge of the later-arriving of signals $A_N$ and $B_N$ lags behind the leading edge of the earlier-arriving of signals $A_N$ and $B_N$. In operation, the input signal delay T_IN for a given stage N is the extent to which signal $A_N$ lags behind signal $B_N$. The delay caused by the respective AND gate (that is, the extent to which the leading edge of the respective signal $A_{N+1}$ lags behind the leading edge of the earlier-arriving of the corresponding signals $A_N$, $B_N$) is linearly related to the absolute value of the input signal delay T_IN.

Meanwhile, signals $A_N$ and $B_N$ are also applied to the first inputs 2092 and threshold inputs 2094, respectively, of the delay comparators 2082, 2084 and 2086, causing the delay comparators 2082, 2084 and 2086 to generate corresponding signals $B_{N+1}$. For each one of the delay comparators 2082, 2084 and 2086, the timing of the leading edge of signal $B_{N+1}$ tracks the timing of the leading edge of the earlier-arriving of signals $A_N$ and $B_N$. In particular, for each one of the delay comparators 2082, 2084 and 2086, the timing of the leading edge of signal $B_{N+1}$ is equal to (1) the timing of the leading edge of the earlier-arriving of signals $A_N$ and $B_N$ plus (2) a delay that is logarithmically inversely related to the absolute value of the input signal delay T_IN.

Subtracting the delay generated by the AND gate from the delay generated by the delay comparator yields the output signal delay T_OUT for any given stage. When the absolute value of the input signal delay T_IN is less than a threshold delay, then the output signal delay T_OUT is a positive value (meaning that the leading edge of signal $B_{N+1}$ generated by the respective delay comparator 2082, 2084 and 2086 precedes the leading edge of signal $A_{N+1}$ generated by the respective AND gate 2076, 2078 and 2080). On the other hand, when the absolute value of the input signal delay T_IN is greater than the threshold delay, then the output signal delay T_OUT is a negative value (meaning that the leading edge of signal $B_{N+1}$ lags behind the leading edge of corresponding signal $A_{N+1}$).

In operation, the first delay comparator 2082 issues a first sign signal ("1" or "0") on a first digital line 2010 to a processor (not shown). The first sign signal is based on which one of the leading edges of the signals $A_1$ and $B_1$ is first received by the first delay comparator 2082, such that the first sign signal reflects the order of the leading edges of signals $A_1$ and $B_1$ applied to the first and threshold inputs 2092 and 2094 of the first delay comparator 2082. Then, the first AND gate 2076 and the first delay comparator 2082 generate signals $A_2$ and $B_2$ which are applied to the AND gate 2078 and the delay comparator 2084 of the second stage 2072. The second delay comparator 2084 issues a second sign signal ("1" or "0") on a second digital line 2112 to the processor. The second sign signal is based on which one of the leading edges of the signals $A_2$ and $B_2$ is first received by the second delay comparator 2084, such that the second sign signal reflects the order of the leading edges of the signals $A_2$ and $B_2$ applied to the inputs 2092 and 2094 of the second delay comparator 2084.

Then, the second AND gate 2078 and the second delay comparator 2084 generate signals $A_3$ and $B_3$ which are applied to the AND gate 2080 and the delay comparator 2086 of the third stage 2074. The third delay comparator 2086 issues a third sign signal ("1" or "0") on a third digital line 2114 to the processor. The third sign signal is based on which one of the leading edges of the signals $A_3$ and $B_3$ is first received by the third delay comparator 2086, such that the third sign signal reflects the order of the leading edges of the signals $A_3$ and $B_3$ applied to the inputs 2092 and 2094 of the third delay comparator 2086. The pattern may be continued for a fourth stage or for more than four stages, as desired.

The devices described herein may be used, for example, in connection with a direct radio-frequency sampling receiver. The receiver may have, or be associated with, a signal-processing circuit for processing the digital codes generated by the analog-to-digital converter systems 10, 500 described herein.

Ordinal numbers ("first," "second," "third," etc.) are used herein only to provide clarity and context, and should not be considered limiting except to distinguish similar elements from each other in context.

What have been described above are examples. Among other things, the present disclosure is not restricted to the use of only OR and AND gates. The logic gates mentioned herein may be replaced by other suitable Boolean gates. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A delay-based analog-to-digital converter system for converting an input voltage into digital output codes, the system comprising:
    logic gates for processing delay signals based on earlier and later arriving signals from preamplifiers;
    first delay comparators and second delay comparators, connected to the logic gates, for generating digital signals representative of most significant bits (MSB) of respective first and second digital codes, and for transmitting delay residue signals representative of less significant bits (LSB) of the first and second digital codes; and
    an auxiliary delay comparator, connected directly to two of the preamplifiers, for generating an auxiliary digital signal for use in generating the digital output codes based on the first and second digital codes.

2. The system of claim 1, further comprising delay-based delay-to-digital converters, connected to the first and second delay comparators, for resolving the less significant bits of the first and second digital codes.

3. The system of claim 2, further comprising a selector circuit, connected to the delay-to digital converters, for selecting one of the first and second digital codes.

4. The system of claim 3, further comprising a zone detector, connected to the selector circuit, for generating a zone selection signal based on the auxiliary digital signal and digital signals from first ones of the first and second delay comparators.

5. The system of claim 4, further comprising delay elements for delaying signals applied to other ones of the first and second delay comparators.

6. The system of claim 1, wherein the logic gates include OR gates and AND gates, and wherein each one of the OR and AND gates is configured to receive delay signals from different ones of the preamplifiers.

7. A delay-based system for generating output delay signals for an analog-to-digital converter, the system comprising:

logic gates having delay signal outputs and inputs for earlier arriving and later arriving signals, the delay signal outputs based on earlier and later arriving signals;

delay comparators, connected to the logic gates, having most significant bits outputs and delay residue signals outputs, the most significant bits outputs representative of the most significant bits of respective digital codes and the delay residue signals outputs representative of less significant bits of the digital codes; and a multiplexer, connected to the delay comparators, having an output operable to provide a selected one of the delay residue signals outputs based on one or more of the delay residue signals outputs.

8. The delay-based system of claim 7, further comprising an array of preamplifiers having different thresholds, connected to the logic gates, for receiving an input voltage, and for generating, based on the input voltage and the thresholds, the earlier and later arriving signals.

9. The delay-based system of claim 8, wherein the logic gates include multiple folding stages between the preamplifier array and the delay comparators.

10. The delay-based system of claim 9, wherein the logic gates include OR gates and AND gates, and wherein each one of the OR and AND gates is configured to receive delay signals from different ones of the preamplifiers.

11. The delay-based system of claim 8, wherein the multiplexer system includes at least first and second, serially arranged multiplexers.

12. The delay-based system of claim 11, wherein the first multiplexer is configured to receive a selector signal from a first one of the delay comparators.

13. The delay-based system of claim 12, wherein the second multiplexer is configured to receive a selector signal from a second one of the delay comparators.

14. A method of converting an input voltage into digital output codes, the method comprising:

processing delay signals based on earlier and later arriving signals generated by preamplifiers;

generating, by a plurality of delay comparators, digital signals representative of most significant bits of respective first and second digital codes;

generating delay residue signals representative of less significant bits of the first and second digital codes; and generating, by an auxiliary delay comparator, an auxiliary digital signal for use in generating the digital output codes based on the first and second digital codes.

15. The method of claim 14, further comprising causing delay-based delay-to-digital converters to resolve the less significant bits of the first and second digital codes.

16. The method of claim 14, further comprising unfolding codes generated by one of the delay-to-digital converters, wherein the unfolding includes generating a zone selection signal based on the auxiliary digital signal and digital signals from first ones of the first and second delay comparators.

17. A method of generating delay signals for an analog-to-digital converter, the method comprising:

generating delay signals based on earlier and later arriving signals;

generating, by delay comparators, digital signals, based on the delay signals, representative of most significant bits of respective digital codes;

generating, based on the delay signals, delay residue signals representative of less significant bits of the digital codes; and outputting a selected one of the delay residue signals based on one or more of the digital signals.

18. The method of claim 17, wherein the logic gates include multiple folding stages between the preamplifier array and the delay comparators.

19. The method of claim 18, wherein the analog-to-digital converter includes at least first and second, serially arranged multiplexers, wherein the first multiplexer receives a selector signal from a first one of the delay comparators, and wherein the second multiplexer receives a selector signal from a second one of the delay comparators.

* * * * *